(12) United States Patent
Setiadi et al.

(10) Patent No.: US 12,494,361 B2
(45) Date of Patent: Dec. 9, 2025

(54) METHOD FOR SELECTIVE DEPOSITION OF SILICON NITRIDE AND STRUCTURE INCLUDING SELECTIVELY-DEPOSITED SILICON NITRIDE LAYER

(71) Applicant: ASM IP Holding B.V., Almere (NL)

(72) Inventors: Agung Setiadi, Kokubunji (JP); Hiroki Matsuda, Tama (JP); Jun Kawahara, Tokyo (JP)

(73) Assignee: ASM IP Holding B.V., Almere (NL)

( * ) Notice: Subject to any disclaimer, the term of this patent is extended or adjusted under 35 U.S.C. 154(b) by 382 days.

(21) Appl. No.: 18/218,726

(22) Filed: Jul. 6, 2023

(65) Prior Publication Data

US 2024/0014030 A1   Jan. 11, 2024

Related U.S. Application Data

(60) Provisional application No. 63/359,934, filed on Jul. 11, 2022.

(51) Int. Cl.
*H01L 21/02* (2006.01)
*H01J 37/32* (2006.01)

(52) U.S. Cl.
CPC .... *H01L 21/0217* (2013.01); *H01J 37/32449* (2013.01); *H01J 37/32816* (2013.01); *H01L 21/02211* (2013.01); *H01L 21/02274* (2013.01); *H01L 21/0228* (2013.01); *H01J 2237/182* (2013.01); *H01J 2237/332* (2013.01)

(58) Field of Classification Search
None
See application file for complete search history.

(56) References Cited

U.S. PATENT DOCUMENTS

| | | | |
|---|---|---|---|
| 9,754,779 B1 | 9/2017 | Ishikawa | |
| 9,911,595 B1* | 3/2018 | Smith | H01L 21/31138 |
| 10,134,757 B2 | 11/2018 | Chun | |
| 10,468,251 B2 | 11/2019 | Ishikawa | |
| 10,720,322 B2 | 7/2020 | Ishikawa | |
| 10,734,244 B2 | 8/2020 | Kim | |
| 11,676,812 B2 | 6/2023 | Ishikawa | |
| 2016/0322213 A1* | 11/2016 | Thompson | H01L 21/67207 |
| 2017/0263437 A1* | 9/2017 | Li | H01L 21/0228 |
| 2017/0342553 A1 | 11/2017 | Yu | |
| 2023/0084552 A1 | 3/2023 | Blanquart | |
| 2023/0120214 A1 | 4/2023 | Mizoguchi | |

FOREIGN PATENT DOCUMENTS

WO   2016178978 A1   11/2016

* cited by examiner

*Primary Examiner* — Asok K Sarkar
(74) *Attorney, Agent, or Firm* — Snell & Wilmer L.L.P.

(57) ABSTRACT

A method for selectively depositing silicon nitride on a first material relative to a second material is disclosed. An exemplary method includes performing one or more deposition cycles and performing a treatments process.

20 Claims, 5 Drawing Sheets

METHOD FOR SELECTIVE DEPOSITION OF SILICON NITRIDE AND STRUCTURE INCLUDING SELECTIVELY-DEPOSITED SILICON NITRIDE LAYER

CROSS-REFERENCE TO RELATED APPLICATIONS

This application claims priority to U.S. Provisional Patent Application Ser. No. 63/359,934 filed Jul. 11, 2022 titled METHOD FOR SELECTIVE DEPOSITION OF SILICON NITRIDE AND STRUCTURE INCLUDING SELECTIVELY-DEPOSITED SILICON NITRIDE LAYER, the disclosure of which is hereby incorporated by reference in its entirety.

FIELD OF INVENTION

The present disclosure generally relates to methods of forming thin films and to structures including the thin films. More particularly, the disclosure relates to methods of forming structures that include a silicon nitride layer and to structures including such layers.

BACKGROUND OF THE DISCLOSURE

Silicon nitride films are used for a wide variety of applications. For example, silicon nitride films can be used to form insulating regions, etch stop regions, etch-resistant protective regions, and the like, on structures formed during the formation of electronic devices.

To form the regions or features including silicon nitride, a silicon nitride film is typically deposited onto a surface of a substrate. The deposited film is then patterned using, for example, photolithography, and then the film is etched to remove some of the silicon nitride to form desired features or areas including the remaining silicon nitride material. As device features continue to decrease in size, it becomes increasingly difficult to pattern and etch silicon nitride films to form features or areas of patterned silicon nitride of desired dimensions. Additionally, lithography and etch steps can increase costs associated with device manufacturing and increase an amount of time required for device fabrication.

Recently, techniques have been developed to selectively form silicon nitride on a portion of the substrate surface. Such techniques often include chemically modifying a surface prior to deposition. While such techniques can work well for some applications, the techniques can introduce unwanted contamination on a substrate surface. Such processes can also increase a complexity of processes to form the structures.

Accordingly, improved methods for forming structures including silicon nitride films are desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

Various embodiments of the present disclosure relate to methods of selectively depositing silicon nitride on a surface of a substrate. While the ways in which various embodiments of the present disclosure address drawbacks of prior methods are discussed in more detail below, in general, various embodiments of the disclosure provide improved methods of selectively depositing silicon nitride on a first surface (e.g. a first material) relative to a second surface (e.g., a second material).

In accordance with at least one embodiment of the disclosure, a method for selectively depositing silicon nitride on the first surface relative to the second surface is provided. The method can include providing a substrate within a reaction chamber of a reactor, performing one or more deposition cycles, and performing a treatment process. In accordance with examples of the disclosure, the substrate can include a surface comprising a first material and a second material. In accordance with further examples, the step of performing one or more deposition cycles includes pulsing a silicon precursor to the reaction chamber for a precursor pulse period, providing a reactant gas to the reaction chamber, and providing a deposition plasma power for a deposition plasma period to form activated species from the reactant gas. In accordance with yet further examples, the step of performing a treatment process includes providing a treatment gas to the reaction chamber and providing a treatment plasma power for a treatment plasma period to form activated species from the treatment gas. The reactant gas can include a reactant and the treatment gas. In accordance with examples of the disclosure, a flowrate of the treatment gas during performing the treatment process is greater than a flowrate of the treatment gas during the step of performing one or more deposition cycles. The first surface can include, for example, silicon nitride or silicon, or the like. The second surface can include a metal oxide, silicon oxide, a metal, or the like. The silicon precursor can include one or more of a silane, a silylamine, an aminosilane, a halogenated silicon compound, or the like. In accordance with further examples, the deposition plasma power is greater than the treatment plasma power. In accordance with yet further examples, a pressure within the reaction chamber during performing one or more deposition cycles is greater than a pressure within the reaction chamber during performing the treatment process. In accordance with yet additional examples, the treatment gas does not comprise the reactant. In accordance with further examples, a duration of the deposition plasma period is less than a duration of the treatment plasma period. The method can include a transition period after the one or more deposition cycles and before the treatment process. In accordance with examples, the pressure within the reaction chamber during the transition period decreases. In accordance with additional examples, a flowrate of the treatment gas to the reaction chamber increases during the transition period.

In accordance with additional embodiments of the disclosure, a structure is provided. A structure can include a substrate, comprising a surface comprising a first material and a second material, and a silicon nitride layer selectively formed on the first material relative to the second material. The silicon nitride layer can be formed using a method described herein.

In accordance with yet additional embodiments of the disclosure, a system is provided. The system can include a reactor comprising a reaction chamber a controller configured to perform the method as described herein.

These and other embodiments will become readily apparent to those skilled in the art from the following detailed description of certain embodiments having reference to the attached figures. The invention is not being limited to any particular embodiments disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
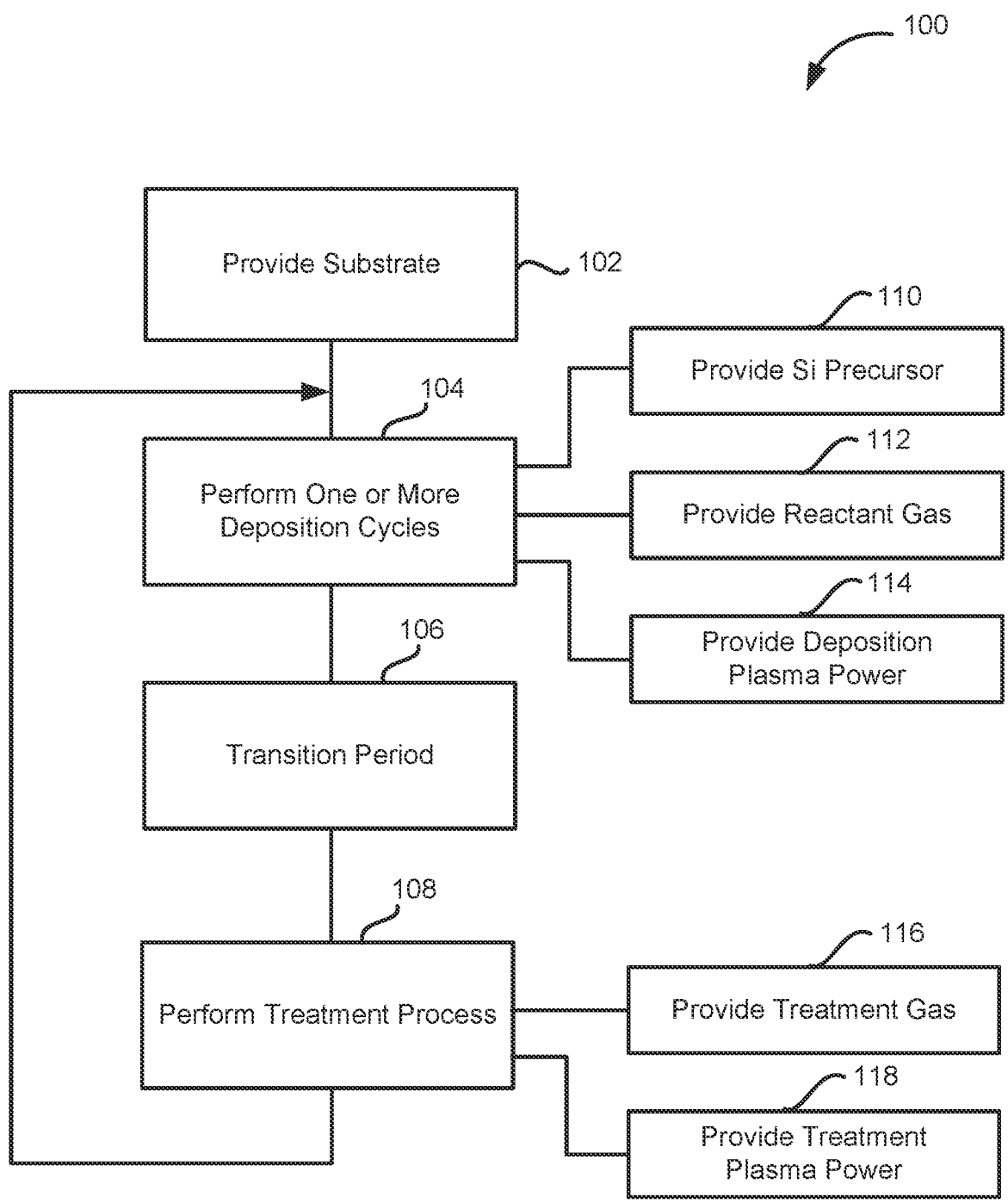
FIG. 1 illustrates a method for selectively depositing silicon nitride in accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

Exemplary embodiments of the disclosure provide improved methods for selectively depositing silicon nitride on a surface of a substrate. Exemplary methods can be used to selectively deposit silicon nitride on a first material relative to a second material without employing a prior in-situ or ex-situ surface treatment before depositing the silicon nitride. Thus, any contamination of the surface that may otherwise result from performing the pre-deposition treatment can be mitigated or avoided. Further, methods described herein can be used to selectively deposit silicon nitride in a relatively cost-effective and simple manner.

In this disclosure, a gas can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, a multi-port injection system, other gas distribution device, or the like, can be used for, e.g., sealing the reaction space, and can include a seal gas, such as a noble gas. In some cases, the term precursor can refer to a compound that participates in the chemical reaction that produces another compound, and particularly to a compound that constitutes a film matrix or a main skeleton of a film. In some cases, the term reactant can be used interchangeably with the term precursor. The term inert gas can refer to a gas that does not take part in a chemical reaction and/or does not become a part of a film matrix to an appreciable extent. Exemplary inert gases include He, Ar, $H_2$, $N_2$ (e.g., when not activated by a plasma) and any combination thereof.

As used herein, the term substrate may refer to any underlying material or materials that may be used to form, or upon which, a device, a circuit, or a film may be formed. A substrate can include a bulk material, such as silicon (e.g., single-crystal silicon) and can include one or more layers overlying the bulk material. Further, the substrate can include various topologies, such as recesses, lines, and the like formed within or on at least a portion of a layer of the substrate. By way of examples, the substrate can include a surface comprising a first material and a second material, as described in more detail below.

As used herein, the term film and/or layer can refer to any continuous or non-continuous structures and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. Alternatively, a film or layer may consist entirely of isolated islands.

As used herein, the term cyclical deposition may refer to a process that includes sequential introduction of precursors and/or reactants into a reaction chamber and/or sequential plasma power pulses to deposit a layer over a substrate. Cyclical deposition processes include processing techniques, such as atomic layer deposition (ALD), cyclical chemical vapor deposition (CCVD), and plasma-enhanced ALD and CCVD.

As used herein, the ALD may refer to a vapor deposition process in which deposition cycles, typically a plurality of consecutive deposition cycles, are conducted in a process chamber. Generally, during each cycle, a precursor is chemisorbed to a deposition surface (e.g., a substrate surface that can include a previously deposited material from a previous ALD cycle or other material), forming about a monolayer or sub-monolayer of material that does not readily react with additional precursor (i.e., a self-limiting reaction). Thereafter, in some cases, a reactant (e.g., another precursor or reaction gas) may subsequently be introduced into the process chamber for use in converting the chemisorbed precursor to the desired material on the deposition surface. The reactant can be capable of further reaction with the precursor. Further, purging steps can also be utilized during each cycle to remove excess precursor from the process chamber and/or remove excess reactant and/or reaction byproducts from the process chamber after conversion of the chemisorbed precursor. In at least some cases, a purge gas can include a reactant that is not activated by a plasma or similar means.

As used herein, the term cyclical chemical vapor deposition may refer to any process wherein a substrate is sequentially exposed to two or more volatile precursors/reactants, which react and/or decompose on a substrate to produce a desired deposition.

A layer including silicon nitride (SiN) can comprise, consist essentially of, or consist of silicon nitride material. Films consisting of silicon nitride can include an acceptable amount of impurities, such as carbon, chlorine or other halogen, and/or hydrogen, that may originate from one or more precursors used to deposit the silicon nitride layers. As used herein, SiN or silicon nitride refers to a compound that includes silicon and nitrogen. SiN can be represented as $SiN_x$, where x varies from, for example, about 0.5 to about 2.0, where some Si—N bonds are formed. In some cases, x may vary from about 0.9 to about 1.7, from about 1.0 to about 1.5, or from about 1.2 to about 1.4. In some embodiments, silicon nitride is formed where Si has an oxidation state of +IV and the amount of nitride in the material may vary.

As used herein, a structure can include a substrate as described herein. Structures can include one or more layers overlying the substrate, such as one or more layers formed according to a method as described herein.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms including, constituted by and having can refer independently to typically or broadly comprising, comprising, consisting essentially of, or consisting of in some embodiments. It shall be understood that when a composition, method, device, etc. is said to comprise certain features, it means that it includes those features, and that it does not necessarily exclude the presence of other features, as long as they do not render the claim unworkable. This notwithstanding, the term comprises or includes the meaning of consists of, i.e., the case when the composition, method, device, etc. in question only includes the features, components, and/or steps that are listed, and does not contain any other features, components, steps, and the like, and includes consisting essentially of.

In this disclosure, any defined meanings do not necessarily exclude ordinary and customary meanings in some embodiments.

Turning now to the figures, FIG. 1 illustrates a method 100 for selectively depositing silicon nitride on a first material of a substrate surface relative to a second material on the substrate surface in accordance with at least one embodiment of the disclosure.

A selective deposition process as described herein can include depositing a greater amount of material on a first material relative to a second material on the substrate surface. For example, a selective process may result in a greater amount of silicon nitride formed on the first material relative to any silicon nitride formed on the second material. In some embodiments of the disclosure, a selectivity of a process can be expressed as a ratio of material deposited (e.g., a layer thickness) on the first material relative to the amount of material (e.g., a layer thickness) formed on the first and second materials combined. For example, if 10 nm of silicon nitride is deposited on the first material and 1 nm of silicon nitride is deposited on the second material, the selective deposition process will be considered to have 91% selectivity. In some embodiments, the selectivity of the methods disclosed herein is greater than 50%, greater than 75%, greater than 80%, greater than 90%, greater than 95%, greater than 99.5%, greater than 98%, greater than 99%, or even about 100%.

Method 100 includes the steps of providing a substrate within a reaction chamber, the substrate comprising a comprising a surface comprising a first material and a second material (step 102), performing one or more deposition cycles (step 104), and performing a treatment process (step 108). As described in more detail below, method 100 can also include a transition period (step 106).

During step 102, a substrate is provided into a reaction chamber of a reactor. In accordance with examples of the disclosure, the reaction chamber can form part of an ALD reactor, such as a plasma-enhanced ALD (PEALD) reactor. Various steps of method 100 can be performed within a single reaction chamber or can be performed in multiple reactor chambers, such as reaction chambers of a cluster tool. Optionally, a reactor including the reaction chamber can be provided with a heater to activate the reactions by elevating the temperature of one or more of the substrate and/or the reactants/precursors. An exemplary reactor suitable for use with method 100 is described in more detail below in connection with FIG. 5.

During step 102, the substrate can be brought to a desired temperature and pressure for step 104. By way of examples, a temperature (e.g., of a substrate or a substrate support) within a reaction chamber can be between about 100° C. and about 600° C. or about 300° C. and about 550° C. A pressure within the reaction chamber can be about 0.5 to about 50 or about 1 to about 30 Torr.

As noted above, the substrate provided during step 102 includes a surface comprising a first material and a second material. The first material can include, for example, silicon or a nitride, such as silicon nitride. The second material can include an oxide, such as a metal oxide or silicon oxide or a metal.

During step 104, one or more deposition cycles are performed. As illustrated, each deposition cycle can include pulsing or providing a silicon precursor to the reaction chamber for a precursor pulse period (step 110), providing a reactant gas to the reaction chamber (step 112), and providing a deposition plasma power for a deposition plasma period to form activated species from the reactant gas (step 114).

During step 110, a silicon precursor is pulsed to the reaction chamber. Exemplary silicon precursors suitable for use with step 110 include silicon precursors that preferentially react with OH terminal groups on a surface of a substrate. Such silicon precursor include silanes, silylamines, and aminosilanes. Particular examples include silane ($SiH_4$), disilane ($Si_2H_6$), trisilane ($Si_3H_8$), tetrasilane ($Si_4H_{10}$), $N(Si_2H_5)_3$, trisilylamine $N(SiH_3)_3$, $N(SiMe_3)(SiH-MeNMe_2)_2$, 2,2-disilyltrisilane ($Si(SiH_3)_4$), trisdimethylaminosilane ($SiH(NMe_2)_3$), bis(diethylamino)silane ($SiH_2(NEt_2)_2$) (BEDAS), bis(tert-butylamino)silane ($SiH_2(NHtBu)_2$) (BTBAS), di-isopropylamido)silane ($SiH_3(NiPr_2)$) (DIPAS), where Me represents a methyl group, Et represents an ethyl group, tBu represents a tert-butyl group, and iPr represents an isopropyl group. Alternatively, some precursors may preferentially react with activated cites comprising —NH terminal bonds. Exemplary precursors that react with such activated cites include halogenated silicon compounds, such as silicon compounds comprising one or more of Cl and I. Particular examples include trichloro disilane ($Si_2Cl_3H_3$), pentachloro disilane ($Si_2Cl_5H$), hexachloro disilane ($Si_2Cl_6$), octachlorotrisilane ($Si_3Cl_8$), dechloro silane ($SiCl_2H_2$), dimethyldichlorosilane ($SiCl_2Me_2$), tetrachloro silane ($SiCl_4$), tetraiodo silane ($SiI_4$), triiodo silane ($SiI_3H$), and deiodo silane ($SiI_2H_2$).

A flowrate of the silicon precursor with a carrier gas to the reaction chamber during step 110 can be about 200 to about 10000 or about 2000 to about 4000 sccm. A duration of the silicon precursor pulse can be between about 0.01 and about 30 seconds or between about 0.1 and about 2 seconds, for example, about 0.3 seconds.

During step 112, a reactant gas is provided to the reaction chamber. Exemplary reactant gases include a reactant and the treatment gas. Exemplary reactants include one or more of nitrogen ($N_2$), hydrogen ($H_2$), argon (Ar), or helium (He), in any combination. Exemplary treatment gases include one or more of hydrogen ($H_2$), nitrogen ($N_2$), argon (Ar), or helium (He), in any combination. In accordance with examples of the disclosure, the treatment gas does not comprise the reactant. In some cases, the reactant gas and the treatment gas comprise a hydrogen-containing gas, such as $H_2$.

A flowrate of the reactant to the reaction chamber during step 112 can be about 1000 to about 50000 or about 10000 to about 30000 sccm. A duration of a reactant pulse can be between about 1 and about 30 seconds or between about 2 and about 10 seconds. A flowrate of the treatment gas to the reaction chamber during step 112 can be about 2 to about 2000 or about to about 1000 sccm. A duration of a treatment gas flow to the reaction chamber can be continuous through one or more deposition cycles and/or through one or more deposition and treatment cycles.

During step 114, a deposition plasma power is provided for a deposition plasma period to form activated species from the reactant gas. The deposition plasma power can have a frequency of between about 100 kHz and about 60 MHz or between about 12 MHz and about 14 MHz. The deposition plasma power can have a power of between about 10 and about 2000 W or between about 100 and about 900 W or be about 700 W for a 300 mm diameter substrate or have a similar power densities for substrates of different cross-sectional dimensions. A duration of step 114 can be between about 0.05 seconds and about 60 seconds or between about 0.5 seconds and about 30 seconds.

During transition period 106—i.e., a period after the one or more deposition cycles of step 104 and before the treatment process of step 108—one or more gas flowrates and/or a reaction chamber pressure can be adjusted for subsequent step 108. For example, a flow of the reactant can cease during transition period 106. Additionally or alternatively, a pressure within the reaction chamber during step 106 (transition period) can decrease. Yet further additionally or alternatively, a flowrate of the treatment gas to the reaction chamber can increase during step 106 (e.g., during the transition period).

During step 108, a treatment process is performed. In the illustrated example, step 108 includes providing a treatment gas to the reaction chamber (step 116) and providing a treatment plasma power for a treatment plasma period to form activated species from the treatment gas (step 118).

A temperature within the reaction chamber (e.g., of a susceptor within the reaction chamber) during step 108 can be as noted above in connection with step 102. A pressure within the reaction chamber during step 108 can be between about 1 Torr and about 30 Torr or between about 2.6 Torr and about 15 Torr.

In accordance with examples of the disclosure, a pressure within the reaction chamber during performing one or more deposition cycles 104 is greater than a pressure within the reaction chamber during performing the treatment process 108. For example, the pressure within the reaction chamber during performing one or more deposition cycles can be at least 2.5 or 10 times greater than the pressure within the reaction chamber during performing the treatment process.

The treatment gas used during step 116 can be as noted above in connection with steps 104 and 106. A flowrate of the treatment gas during performing the treatment process 108 can be greater than a flowrate of the treatment gas during the step of performing one or more deposition cycles. For example, the flowrate of the treatment gas during performing the treatment process can be greater than 10 times or greater than 200 times the flowrate of the treatment gas during the step of performing one or more deposition cycles. By way of particular examples, the flowrate of the treatment gas to the reaction chamber during step 108 can be between about 0.1 and about 2 slm or be between about 0.5 and about 1 slm.

During step 118, a treatment plasma power is provided for a treatment plasma period to form activated species from the treatment gas. The treatment plasma power can have a frequency of between about 100 kHz and about 60 MHz or between about 12 MHz and about 14 MHz. The treatment plasma power can have a power of between about 10 and about 2000 W or between about 100 and about 900 W or be about 600 W for a 300 mm diameter substrate or have a similar power densities for substrates of different cross-sectional dimensions. A duration of step 118 can be between about 0.05 seconds and about 300 seconds or between about 0.5 seconds and about 60 seconds. In accordance with examples of the disclosure, the deposition plasma power provided during step 114 is greater than the treatment plasma power provided during step 118. In accordance with further examples, a duration of the deposition plasma period is less than a duration of the treatment plasma period. For example, the deposition plasma period can be less than 50%, less than 25%, less than 20%, or less than 16% of the duration of the treatment plasma period.

As illustrated in FIG. 1, steps 104-108 can be repeated a number of times to selectively deposited silicon nitride on the first material relative to the second material. Further, as noted above, step 104 can be repeated a number of times prior to proceeding to step 106 or 108.

Figure 2:
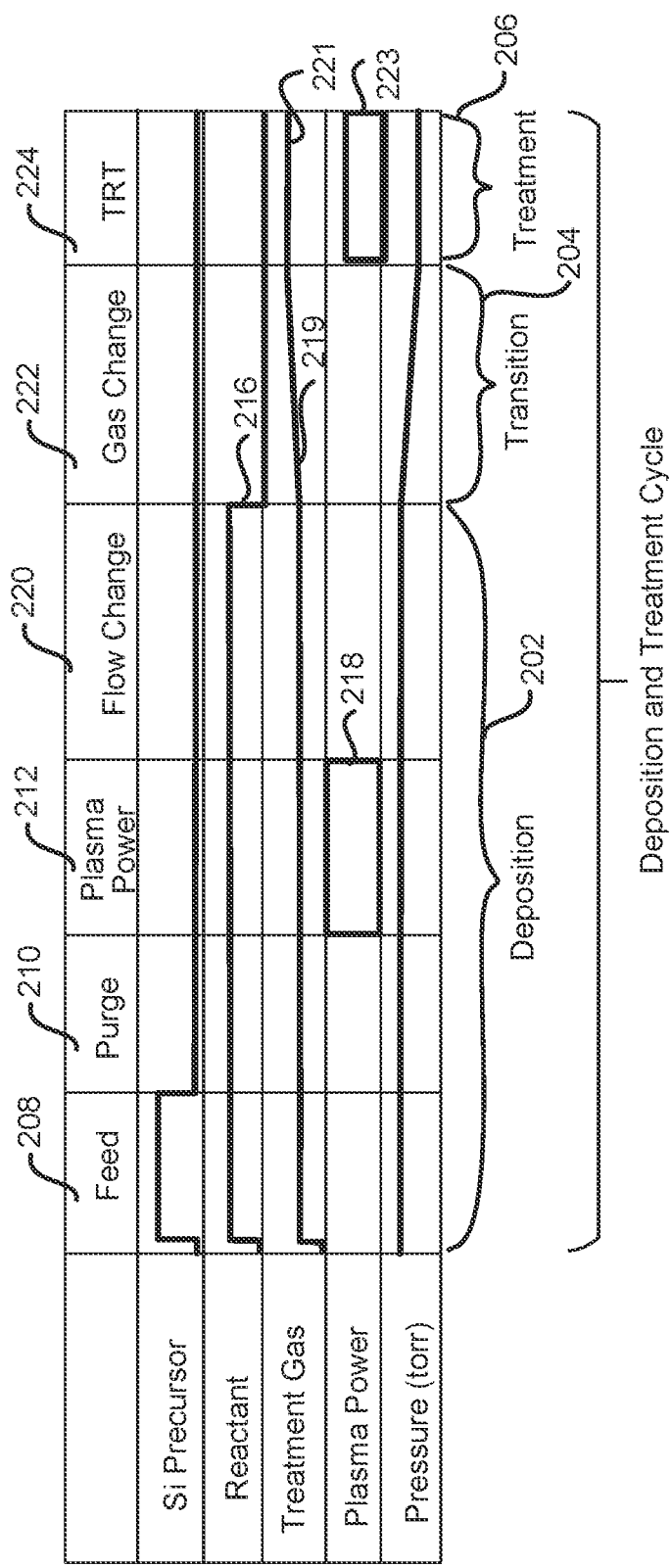
FIG. 2 illustrates a timing sequence in accordance with at least one embodiment of the disclosure.

FIG. 2 illustrates a timing sequence 200 suitable for use with method 100. Timing sequence includes a deposition period 202, a transition period 204, and a treatment period 206.

Deposition period 202 can be the same or similar to step 104 described above. In the illustrated example, deposition period 202 includes a feed period 208, a purge period 210, a deposition plasma period 212, and a flow change period 220.

During feed period 208, the silicon precursor is provided to the reaction chamber for a precursor pulse period 214, the reactant is provided (e.g., for part of reactant period 216), and the treatment gas is provided to the reaction chamber. The silicon precursor, reactant, and treatment gas and the respective flowrates can be as noted above in connection with step 104.

After period 208, the reaction chamber can be purged during purge period 210. The purge can be effected by continuing to flow the reactant and the treatment gas (collectively the reactant gas). A duration of period 208 can be from about 0.05 to about 120 or from about to about 10 seconds.

During deposition plasma period 212, while the reactant and the treatment gas continue to flow to the reaction chamber, a deposition plasma power is provided for a deposition plasma period to form activated species from the reactant gas, as described above in connection with step 114.

During flow change period 220, the reactant and the treatment gas can continue to flow to the reaction chamber. Flow change period 220 can be used to purge the reaction chamber after deposition plasma period 212. At the end of n deposition cycles (where n can range from, for example, about 1 to about 10), the flow of the reactant can cease or be significantly reduced (e.g., by 90% or more) at the end of flow change period 220. The flowrate of the treatment gas can remain substantially the same (e.g., within ±10%) of the flowrate of the treatment gas during deposition period 202.

Transition period 204 can include a gas change period 222. Transition period 204 can be the same or similar to transition period 106 described above.

During gas change period 222, a flowrate of the reactant has been reduced or has ceased and a flowrate of the treatment gas is increased (shown as line 219), such that the flowrate of the treatment gas is greater at or near an end of gas change period 222 than a flowrate of the treatment gas during deposition period 202 and/or during flow change period 220. For example, the flowrate of the treatment gas during gas change period 222 can increase linearly as illustrated. The flowrate of the treatment gas can be increased to, for example, greater than 10 times the flowrate of the treatment gas during the step of performing one or more deposition cycles or of period 220. Further, as illustrated in FIG. 2, a pressure during gas change period 222 can be reduced within the reaction chamber—e.g., to a pressure noted above in connection with step 108.

Treatment period 224 can be the same or similar to step 108 described above. As illustrated, treatment step can include providing treatment gas, illustrated with line segment 221 and providing a treatment plasma power (e.g., for a treatment plasma period 223) to form activated species from the treatment gas to thereby treat the (e.g., selectively deposited) silicon nitride.

Figure 3:
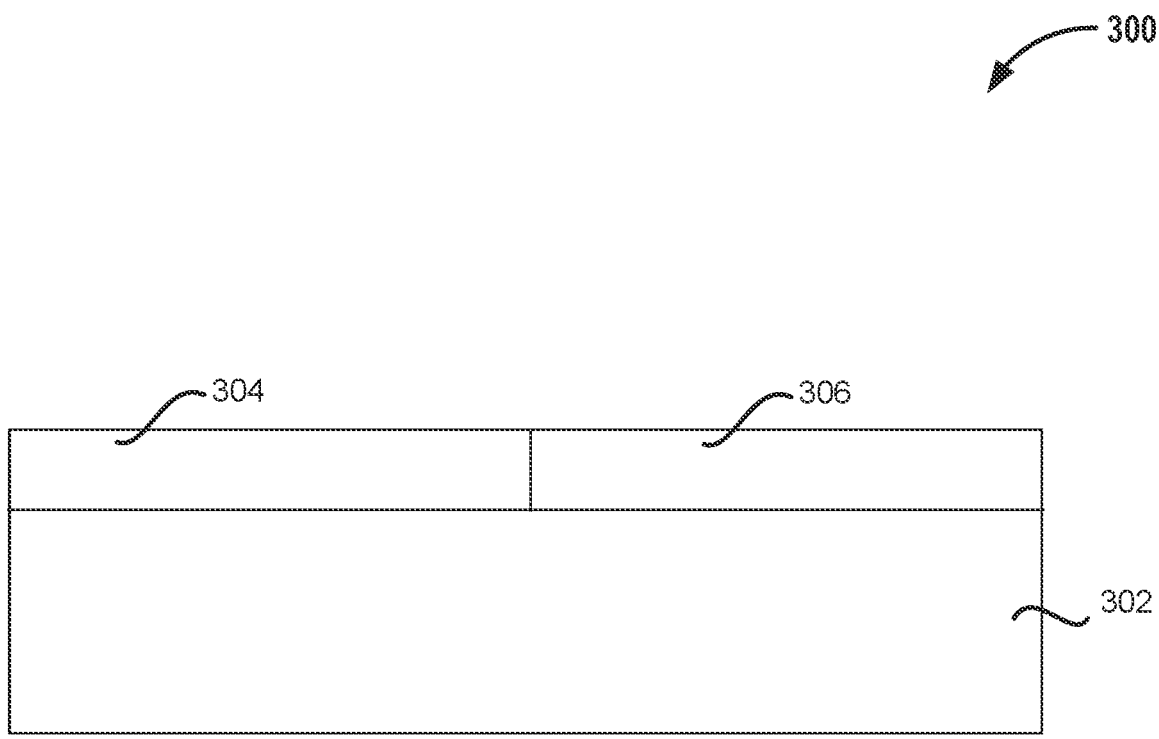
FIGS. 3 and 4 illustrate structures in accordance with examples of the disclosure.

FIG. 3 illustrates a structure 300 in accordance with exemplary embodiments of the disclosure. Structure 300 includes a substrate 302, a first material 304, and a second material 306. As illustrated, first material 304 and second material 306 are formed on a surface of substrate 302.

Substrate 302 can include any suitable material, such as semiconductor material and materials typically used to form semiconductor devices. By way of example, substrate 302 can be or include silicon, other Group IV semiconductor material, a Group III-V semiconductor, and/or a Group II-VI semiconductor.

First material 304 can include any of the first materials noted above. For example, first material 304 can include a silicon-containing material, such as silicon or silicon nitride. Similarly, second material 306 can include any of the second materials noted herein. By way of examples, second material 306 can include a metal or an oxide, such as an elemental metal or alloy, a metal oxide (e.g., $HfO_2$, $ZrO_2$, or the like), or silicon oxide (which may include carbon and/or nitrogen).

Figure 4:
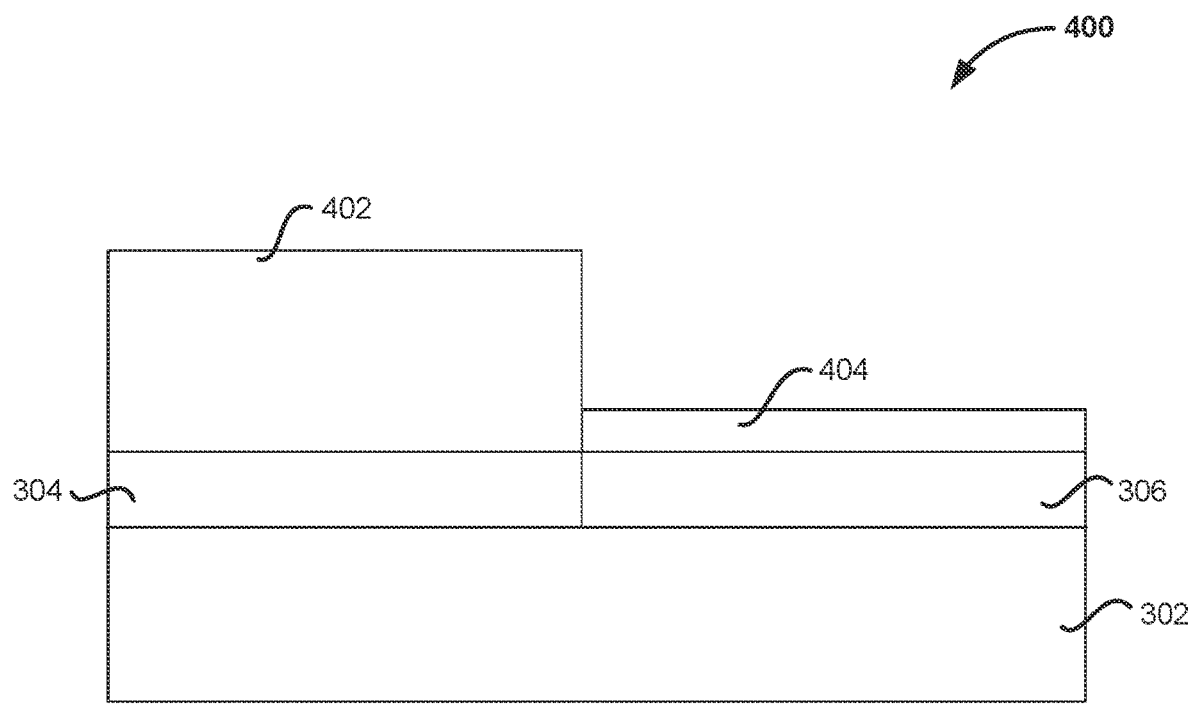

FIG. 4 illustrates a structure 400, in which silicon nitride 402 has been selectively deposited over (e.g., in direct contact with) first material 304, relative to silicon nitride 404 deposited over (e.g., in direct contact with) second material 306 using a method as described herein. In the illustrated example, the selectivity is not 100%, but rather an amount of silicon nitride 404 can be formed overlying second material 306. In other cases, the selectivity may be 100% or as described above.

Figure 5:
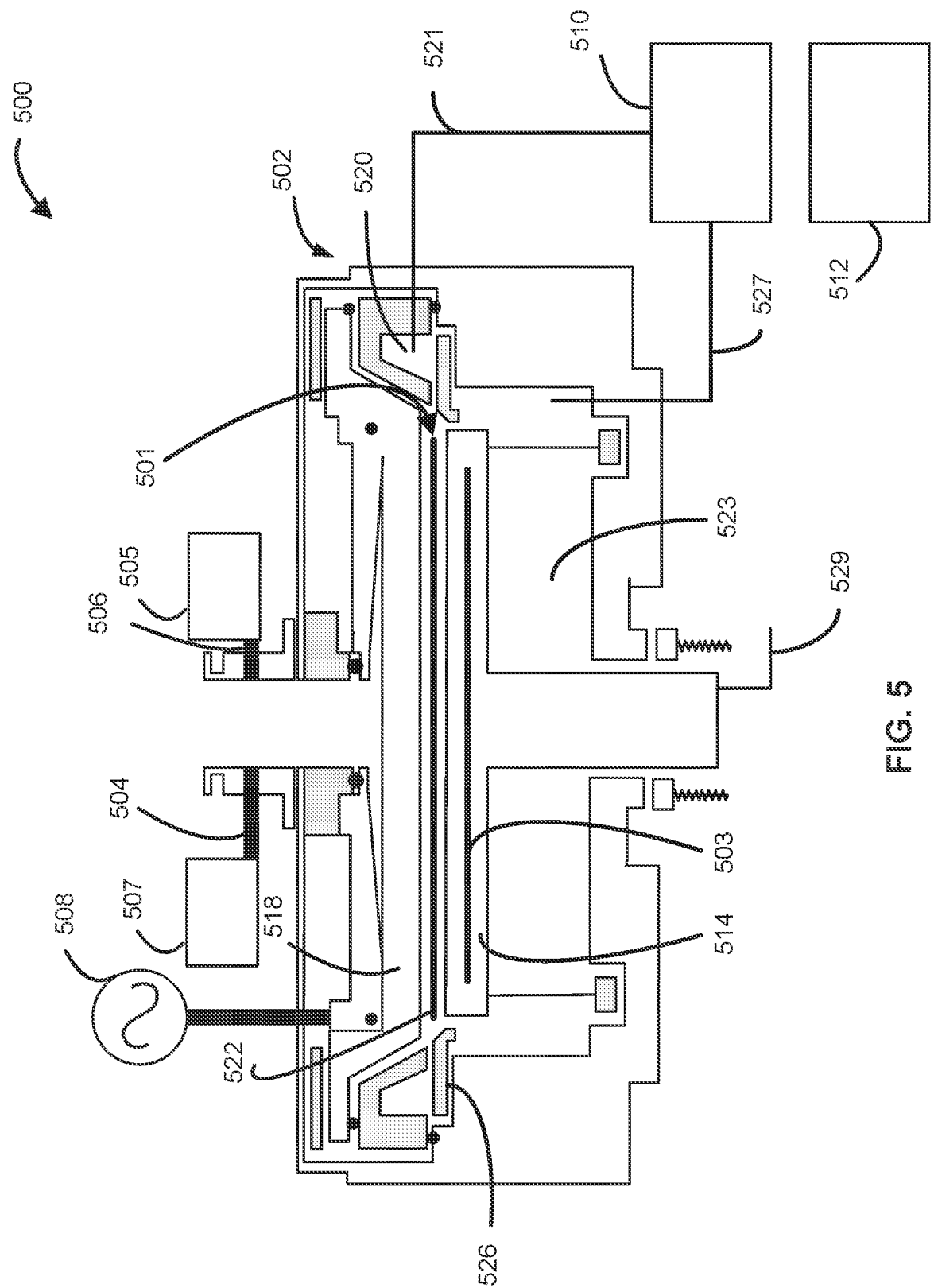
FIG. 5 illustrates a system in accordance with examples of the disclosure.

Turning now to FIG. 5, a reactor system 500 in accordance with exemplary embodiments of the disclosure is illustrated. Reactor system 500 can be used to perform one or more steps or substeps (e.g., of method 100) as described herein and/or to form one or more structures or portions thereof as described herein.

Reactor system 500 includes a pair of electrically conductive flat-plate electrodes 514, 518 typically in parallel and facing each other in an interior 501 (reaction zone) of a reaction chamber 502. Although illustrated with one reaction chamber 502, reactor system 500 can include two or more reaction chambers. A plasma can be excited within interior 501 by applying, for example, RF power from plasma power source(s) 508 to one electrode (e.g., electrode 518) and electrically grounding the other electrode (e.g., electrode 514). A temperature regulator 503 (e.g., to provide heat and/or cooling) can be provided in a lower stage 514 (the lower electrode), and a temperature of a substrate 522 placed thereon can be kept at a desired temperature, such as the temperatures noted above. Electrode 518 can serve as a gas distribution device, such as a shower plate or showerhead. Precursor gases, reactant gases, treatment gases, and a carrier or inert gas, if any, or the like can be introduced into reaction chamber 502 using one or more gas lines (e.g., gas line 504 and gas line 506, respectively, coupled to a (e.g., treatment or reactant source) 507 and a (e.g., silicon precursor) source 505). For example, an inert gas and a reactant (e.g., as described above) can be introduced into reaction chamber 502 using line 504 and/or a silicon precursor and a carrier gas (e.g., as described above) can be introduced into the reaction chamber using line 506. Although illustrated with two inlet gas lines 504, 506, reactor system 500 can include any suitable number of gas lines.

In reaction chamber 502, a circular duct 520 with an exhaust line 521 can be provided, through which gas in the interior 501 of the reaction chamber 502 can be exhausted to an exhaust source 510. Additionally, a transfer chamber 523 can be provided with a seal gas line 529 to introduce seal gas into the interior 501 of reaction chamber 502 via the interior (transfer zone) of transfer chamber 523, wherein a separation plate 526 for separating the reaction zone and the transfer chamber 523 can be provided (a gate valve through which a substrate is transferred into or from transfer chamber 523 is omitted from this figure). Transfer chamber 523 can also be provided with an exhaust line 527 coupled to an exhaust source 510. In some embodiments, continuous flow of a carrier gas to reaction chamber 502 can be accomplished using a flow-pass system (FPS).

Reactor system 500 can include one or more controller(s) 512 programmed or otherwise configured to cause one or more method steps as described herein to be conducted. Controller(s) 512 are coupled with the various power sources, heating systems, pumps, robotics and gas flow controllers, or valves of the reactor, as will be appreciated by the skilled artisan. By way of example, controller 512 can be configured to control gas flow of a silicon precursor, a reactant, a treatment gas, and/or an inert gas into at least one of the one or more reaction chambers to selectively deposit silicon nitride as described herein. Controller 512 can be further configured to provide power to form a plasma—e.g., within reaction chamber 502. Controller 512 can be similarly configured to perform additional steps as described herein.

Controller 512 can include electronic circuitry and software to selectively operate valves, manifolds, heaters, pumps and other components included in system 500. Such circuitry and components operate to introduce precursors, reactants, treatment gases, and purge gases from the respective sources. Controller 512 can control timing of gas pulse sequences, temperature of the substrate and/or reaction chamber, pressure within the reaction chamber, plasma power, and various other operations to provide proper operation of the system 500, such as in the performance of method 100 and/or sequence 200.

Controller 512 can include control software to electrically or pneumatically control valves to control flow of precursors, reactants, and/or purge gases into and out of the reaction chamber 502. Controller 512 can include modules, such as a software or hardware component, e.g., a FPGA or ASIC, which performs certain tasks. A module can advantageously be configured to reside on the addressable storage medium of the control system and be configured to execute one or more processes.

In some embodiments, a dual chamber reactor (two sections or compartments for processing substrates disposed close to each other) can be used, wherein a reactant gas and a noble gas can be supplied through a shared line, whereas a precursor gas is supplied through unshared lines.

During operation of system 500, substrates, such as semiconductor wafers, are transferred from, e.g., a substrate handling area 523 to interior 501. Once substrate(s) are transferred to interior 501, one or more gases, such as precursors, reactants, treatment gases, carrier gases, and/or purge gases, are introduced into reaction chamber 502.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. A method for selectively depositing silicon nitride, the method comprising:
    providing a substrate, comprising a surface comprising a first material and a second material, within a reaction chamber of a reactor;
    performing one or more deposition cycles, wherein each deposition cycles comprises:
        pulsing a silicon precursor to the reaction chamber for a precursor pulse period;
        providing a reactant gas to the reaction chamber; and
        providing a deposition plasma power for a deposition plasma period to form activated species from the reactant gas; and
    performing a treatment process comprising:
        providing a treatment gas to the reaction chamber; and
        providing a treatment plasma power for a treatment plasma period to form activated species from the treatment gas,
    wherein the reactant gas comprises a reactant and the treatment gas, and
    wherein the silicon nitride is selectively deposited on the first material relative to the second material.

2. The method of claim 1, wherein the first material comprises silicon nitride or silicon.

3. The method of claim 1, wherein the second material comprises a metal oxide, silicon oxide, or a metal.

4. The method of claim 1, wherein the reactant comprises one or more of nitrogen ($N_2$), hydrogen ($H_2$), argon (Ar), helium (He).

5. The method of claim 1, wherein the treatment gas comprises one or more of hydrogen ($H_2$), nitrogen ($N_2$), argon (Ar), helium (He).

6. The method of claim 1, wherein the silicon precursor comprises one or more of a silane, a silylamine, an aminosilane, and a halogenated silicon compound.

7. The method of claim 1, wherein the deposition plasma power is greater than the treatment plasma power.

8. The method of claim 1, wherein a pressure within the reaction chamber during performing one or more deposition cycles is greater than a pressure within the reaction chamber during performing the treatment process.

9. The method of claim 8, wherein the pressure within the reaction chamber during performing one or more deposition cycles is at least 2.5 times greater than the pressure within the reaction chamber during performing the treatment process.

10. The method claim 1, wherein the treatment gas does not comprise the reactant.

11. The method of claim 1, wherein a flowrate of the treatment gas during performing the treatment process is greater than a flowrate of the treatment gas during the step of performing one or more deposition cycles.

12. The method of claim 11, wherein the flowrate of the treatment gas during performing the treatment process is greater than 10 times the flowrate of the treatment gas during the step of performing one or more deposition cycles.

13. The method of claim 1, comprising repeating the one or more deposition cycles prior to performing the treatment process.

14. The method of claim 1, wherein a duration of the deposition plasma period is less than a duration of the treatment plasma period.

15. The method of claim 1, wherein the treatment gas is continually flowed to the reaction chamber during a plurality of deposition cycles.

16. The method of claim 1, wherein the treatment gas is continually flowed to the reaction chamber during the one or more deposition cycles and the treatment process cycles.

17. The method of claim 1, wherein the method comprises a transition period after the one or more deposition cycles and before the treatment process.

18. The method of claim 17, wherein a pressure within the reaction chamber during the transition period decreases.

19. The method of claim 17, wherein a flowrate of the treatment gas to the reaction chamber increases during the transition period.

20. A system comprising:
    a reactor comprising a reaction chamber; and
    a controller configured to perform the method of claim 1.

* * * * *